US008565345B2

(12) United States Patent
Gupta

(10) Patent No.: US 8,565,345 B2
(45) Date of Patent: Oct. 22, 2013

(54) OVERSAMPLING DIGITAL RADIO FREQUENCY TRANSMITTER

(75) Inventor: Deepnarayan Gupta, Hawthorne, NY (US)

(73) Assignee: Hypres Inc., Elmsford, NY (US)

( * ) Notice: Subject to any disclaimer, the term of this patent is extended or adjusted under 35 U.S.C. 154(b) by 1635 days.

(21) Appl. No.: 11/966,906

(22) Filed: Dec. 28, 2007

(65) Prior Publication Data

US 2008/0101501 A1 May 1, 2008

Related U.S. Application Data

(63) Continuation of application No. 11/424,121, filed on Jun. 14, 2006, now Pat. No. 7,362,125, and a continuation-in-part of application No. 11/360,749, filed on Feb. 23, 2006, now Pat. No. 7,443,719, and a continuation-in-part of application No. 11/243,020, filed on Oct. 4, 2005, now Pat. No. 7,508,230, and a continuation-in-part of application No. 11/243,022, filed on Oct. 4, 2005, now abandoned, and a continuation-in-part of application No. 11/243,019, filed on Oct. 4, 2005, now Pat. No. 7,680,474.

(51) Int. Cl.
*H04L 27/04* (2006.01)
*H04L 12/50* (2006.01)

(52) U.S. Cl.
USPC ............................ 375/299; 370/358; 370/360

(58) Field of Classification Search
USPC ......... 375/144, 146, 148, 260, 267, 295–297, 375/299, 316, 347, 349; 370/352–356, 358, 370/360; 455/428, 500, 78, 101, 103, 455/114.3, 132
See application file for complete search history.

(56) References Cited

U.S. PATENT DOCUMENTS

| | | | | |
|---|---|---|---|---|
| 5,946,343 | A * | 8/1999 | Schotz et al. | 375/141 |
| 6,865,639 | B2 | 3/2005 | Herr | |
| 6,917,537 | B2 | 7/2005 | Bunyk | |
| 6,960,929 | B2 | 11/2005 | Bedard | |
| 2002/0012138 | A1* | 1/2002 | Graves et al. | 359/118 |
| 2005/0080975 | A1* | 4/2005 | Elledge et al. | 710/316 |
| 2006/0038710 | A1* | 2/2006 | Staszewski et al. | 341/143 |
| 2006/0291589 | A1* | 12/2006 | Eliezer et al. | 375/302 |

(Continued)

OTHER PUBLICATIONS

Hashimoto, et al., “Implementation of a 4×4 Switch with Passive Interconnects”, IEEE Trans. Appl. Supercon., vol. 15, No. 2, Jun. 2005, pp. 356-359.
Brock, et al., “Superconductor Digital Development for Software Radio”, IEEE Commun, Mag., pp. 174-179, Feb. 2001.

(Continued)

*Primary Examiner* — Young T. Tse
(74) *Attorney, Agent, or Firm* — Steven M. Hoffberg; Ostrolenk Faber LLP

(57) ABSTRACT

A system and method for transmitting a radio frequency signal, comprising providing a plurality of digital radio frequency signal inputs, each having a respective associated clock, wherein a respective digital radio frequency signal input has a digital data rate sufficient to represent both the information and carrier, if any, in a corresponding analog representation of the digital radio frequency signal; selectively controlled a non-blocking switch matrix with a control signal, the non-blocking switch matrix receiving the plurality of inputs and associated clocks, and producing a plurality of regenerated outputs and associated regenerated clocks; producing an analog representation of the radio frequency signal input with a respective digital to analog converter for each of the regenerated outputs and associated regenerated clocks; and communicating the analog representations from the respective digital to analog converters to a location for transmission thereat.

45 Claims, 10 Drawing Sheets

(56) References Cited

U.S. PATENT DOCUMENTS

| | | | | |
|---|---|---|---|---|
| 2008/0101503 | A1* | 5/2008 | Gupta | 375/338 |
| 2008/0107213 | A1* | 5/2008 | Gupta et al. | 375/340 |
| 2008/0119230 | A1* | 5/2008 | Guda et al. | 455/562.1 |

OTHER PUBLICATIONS

Likharev, et al., “RSFQ Logic/Memory Family: A new Josephson junction technology for sub-THz digital systems”, IEEE Trans. Appl. Supercond., vol. 1, pp. 3-28, 1991.

* cited by examiner

OVERSAMPLING DIGITAL RADIO FREQUENCY TRANSMITTER

CROSS REFERENCE TO RELATED APPLICATIONS

This application is related to and claims priority to the following applications: (1) U.S. application Ser. No. 11/243,019, filed Oct. 5, 2005, by inventors Alexander Kirichenko, Deepnarayan Gupta, and Saad Sarwana entitled Superconducting Digital Mixer; (2) U.S. application Ser. No. 11/243,022, filed Oct. 5, 2005, by inventor Alexander Kirichenko entitled A Digital Programmable Frequency Divider; (3) U.S. application Ser. No. 11/243,020, filed Oct. 5, 2005, by inventor Alexander Kirichenko entitled A Digital Programmable Phase Generator; (4) U.S. application Ser. No. 11/360,749, filed Feb. 23, 2006, by inventors Alexander Kirichenko, Timur Filippov, and Deepnarayan Gupta entitled Superconducting Circuit for High-Speed Lookup Table; (5) U.S. application Ser. No. 11/424,121, filed Jun. 14, 2006, by inventors Deepnarayan Gupta and Alexander Kirichenko entitled Digital Routing Switch Matrix for Digitized Radio-Frequency Signals. Each of these applications is hereby incorporated by reference in its entirety.

BACKGROUND OF THE INVENTION

1. Field of the Invention

This invention relates to the field of switching circuits and, more particularly, for switching circuits for advanced digital radio receivers and transmitters.

2. Description of the Prior Art

A simple classic radio receiver consists of a single antenna coupled to a downconverter that extracts a single “baseband” channel. In a modern receiver, the baseband signal is digitized with an analog-to-digital converter (ADC) and further processed in the digital domain. A classic transmitter contains essentially the same components working in the reverse direction; a transceiver contains both a transmitter and a receiver packaged together.

A multi-band, multi-channel RF communications system (see FIG. 1*a*) can include multiple antennas, and can extract multiple baseband channels or groups of channels simultaneously. This requires a switch matrix, which permits distribution of various signals between each antenna (corresponding to each band) and one or more appropriate radio receiver channels. If the system is to be flexible and reconfigurable, it should be possible to redirect input signals to selected output channels.

The signal at the antenna is an analog waveform, even if it may be encoding a digital signal. In a conventional receiver system of the prior art, as illustrated in FIG. 1*a*, both the switch matrix and the channelizing receivers are analog components, and similarly for the transmitter. However, these band-specific precision analog components are often expensive and limited in their flexibility and reconfigurability. Furthermore, these analog switching systems have severe deficiencies in terms of losses, isolation, crosstalk, and ability to multicast.

For these reasons, the communications industry would like to move toward an approach known as “software-defined radio” (SDR) or “software radio”, where all data processing is carried out in the digital domain, except right at the antenna itself. This requires ultrafast data converters, with sampling rates of tens of GHz and excellent linearity. ADCs with the requisite properties have recently been demonstrated, based on superconductor electronics using Josephson junctions, with circuit designs based on rapid-single-flux-quantum logic (RSFQ). It is natural that this data conversion be carried out right at the antenna, as illustrated in FIG. 1*b*. But in this case, the switching must also be carried out directly on the digital-RF signals. Furthermore, the precision and linearity of these signals can be maintained in the distribution network only if the sampling clock is distributed along with the data bits. This requires a new type of digital-RF switch matrix, which has not been reported before, and which is the subject of the present invention.

Furthermore, the digital-RF transceiver architecture allows natural partitioning between band-specific (analog) and band-independent (digital) components. Analog components, such as antennas and amplifiers are optimized for performance within a particular frequency band. Even data converters between analog and digital formats, ADCs and DACs, work best with designs that target specific frequency bands. Furthermore, an ADC or DAC optimized for a particular frequency band will typically have a particular sampling frequency (clock frequency $f_{clock}$) that is preferred for best performance. For example, a radio-frequency bandpass ADC designed for a center frequency f) may exhibit the greatest dynamic range for a sampling frequency that is four times the center frequency ($f_{clock}=4\times f$)). On the contrary, digital signal processing units, operating on numbers, are independent of the signal characteristics. This partitioning enables the true software radio paradigm by allowing full software programmability of the RF distribution network. Superconductor electronics are fast enough to digitize at multi-GHz RF and perform subsequent processing completely in the digital domain.

Switch matrices based on superconducting electronic circuits have been recently reported by several inventors. For example, see (1) U.S. Pat. No. 6,960,929, issued Nov. 1, 2005 by inventor Fernand D. Bedard, entitled Superconductive Crossbar Switch, (2) U.S. Pat. No. 6,917,537, issued Jul. 12, 2005 by inventor Paul I. Bunyk entitled RSFQ Batcher-Banyan Switching Network, (3) U.S. Pat. No. 6,865,639, issued Mar. 8, 2005 by inventor Quentin P. Herr entitled Scalable Self-Routing Superconductor Switch, and (4) Hashimoto et al., Implementation of a 4×4 Switch With Passive Interconnects, IEEE Trans. Appl. Supercon., vol 15, no. 2, June 2005, pp. 356-359.

However, none of these patents was designed for an application in RF communications, and none of these include switches which route the clock signal together with the data signal, which are two of several reasons this invention distinguishes over the prior art. See also the article by D. K. Brock, O. A. Mukhanov, and J. Rosa, “Superconductor Digital Development for Software Radio,” IEEE Commun. Mag., pp. 174-179, February 2001, and K. K. Likharev and V. K. Semenov, “RSFQ Logic/Memory Family: A new Josephson junction technology for sub-THz digital systems”, IEEE Trans. Appl. Supercond., vol. 1, pp. 3-28, 1991.

Problems of the Prior Art

The prior art switches have been expensive and limited in their flexibility and ability to reconfigure. In addition, they have severe deficiencies in terms of losses, isolation, cross talk and ability to multicast.

It is natural and desirable that data conversion be carried out right at the antenna, but, in such a case, the switching must also be carried out directly on the digital-RF signals. Further, the precision and linearity of these signals can be maintained in the distribution network only if the sampling clock is distributed along with the data bits. This requires and new type of digital-RF switch matrix which is the subject of the present invention.

SUMMARY AND OBJECTS OF THE INVENTION

A multi-carrier, multi-channel RF communication system requires a switch matrix to route various signals between a set of antennas and a set of radio transceivers. This can be carried out most efficiently in the digital domain, but requires the use of ultrafast circuits that can accurately process multi-GHz RF signals.

One aspect of the invention is directed to a switch matrix which is suitable for routing various signals between a set of antennas and a set of radio transceivers. The transceivers can be multi-carrier, multi-channel RF communication devices. The routing is carried out in the digital domain and uses ultra fast superconductive circuits that can accurately process multi-gigahertz RF signals. For best performance the basic switching cell must carry both the data bits and the sampling clock, where the sampling clock may be at different frequencies for signals from different RF bands distributed within the same switch matrix.

Preferred exemplary embodiments of the invention are implemented using ultra fast RSFQ superconducting logic elements.

It is therefore an object to provide a radio frequency transmitter, comprising a plurality of digital radio frequency signal inputs, each having a respective associated clock, wherein a respective digital radio frequency signal input has a digital data rate sufficient to represent both the information and carrier, if any, in a corresponding analog representation of the digital radio frequency signal; a non-blocking switch matrix, selectively controlled by a control signal, receiving the plurality of inputs and associated clocks, and producing a plurality of regenerated outputs and associated regenerated clocks; a respective digital to analog converter for each of the regenerated outputs and associated regenerated clocks, adapted to produce an analog representation of the radio frequency signal input; and a plurality of analog signal couplers, for communicating the analog representations from the respective digital to analog converters to a location for transmission thereat. The associated clock for at least two of the respective digital to analog converters may be independent, having the same or different frequency, phase, jitter or other characteristic.

The associated clock for a respective digital to analog converter operates above a Nyquist rate of the analog representation. Thus, the digital to analog converter may operate at frequencies in excess of 350 mega-samples per second, and, for example, at frequencies of 1, 5, 10, 20, 40 or even 100 giga-samples per second, or higher. Typically, the preferred oversampling range is at least 4 times the highest substantial-power frequency component in the signal to be synthesized. Because there is no particular requirement for up-conversion or frequency translation of the signals, the band may be a “baseband” signal, that is, one in which energy components extend to DC or near 0 Hertz. Practically, a transmitted radio frequency signal will not have such low frequencies, but in some cases may include signals in the kilohertz or higher range. Each analog signal coupler may therefore be adapted to couple a radio frequency signal within a band, the band having an upper range limit, the associated clock for the respective digital to analog converter operating above a Nyquist rate for the upper range limit.

Each analog signal coupler may be adapted to couple a radio frequency signal within a band, the radio frequency signal comprising an information signal, the associated clock for the respective digital to analog converter operating above a minimum rate required to synthesize an analog radio frequency signal from the digital radio frequency signal. Typically, digital data will be fed to the converter at the clock rate; however, in some cases, the digital to analog converter clock may be asynchronous with the digital radio frequency signal.

A digital radio frequency signal processor may be provided, adapted to generate a digital representation of an information signal modulated within a radio frequency signal.

The non-blocking switch matrix may be adapted to dynamically reconfigure a mapping of inputs to regenerated outputs under control of the control signal substantially within a period of an associated clock.

At least two of the plurality of analog signal couplers may be adapted to couple analog signals having information signals modulated on different radio frequency bands, with the non-blocking switch matrix routing and regenerating outputs and associated clocks to respective different digital to analog converters.

The regenerated output may be, for example, an oversampled discrete representation of the analog representation.

At least one of the digital to analog converters and the non-blocking switch matrix may comprise a plurality of superconducting elements operating at cryogenic temperatures. For example, these may include superconducting Niobium-based Josephson Junctions, configured into RFSQ local devices.

The non-blocking switch matrix may be adapted to simultaneously multicast the regenerated output and associated regenerated clock of a single output and associated clock for processing by a plurality of digital to analog converters. Thus, the switch matrix may support a one-to-many fan-out.

At least one of the respective digital to analog converters may receive a parallel multiple binary bit digital representation of the representation of the radio frequency signal, the parallel multiple binary bit digital representation and associated clock being routed from the non-blocking switch matrix. Of course, a single bit converter and signal distribution architecture may also be employed.

The regenerated output and associated regenerated clock may be routed to maintain proper synchronization. The regenerated output and associated regenerated clock may be routed together to maintain proper synchronization at the digital to analog converter. The system may further comprise a delay compensation network adapted to maintain proper synchronization among a plurality of data paths, each data path communicating a regenerated output and a respective regenerated clock. The non-blocking switch matrix may comprise a delay compensation network adapted to maintain proper synchronization among a plurality of data paths, each data path communicating a regenerated output and a respective regenerated clock. The non-blocking switch matrix may comprise a Banyan network.

The non-blocking switch matrix may be is adapted to simultaneously distribute a plurality of regenerated outputs with respective associated regenerated clocks, the plurality of associated regenerated clocks having respectively different clock frequencies and/or different phases, or be associated with different clock sources.

The non-blocking switch matrix may have an input to output relationship between a respective digital radio frequency signal input and digital to analog converter which is dynamically reconfigurable under automated digital control.

The non-blocking switch matrix may comprise a plurality of switch elements, each controlled by at least one digital control line, to provide a digitally controllable input to output relationship between a respective digital radio frequency signal input and digital to analog converter, wherein a respective digital control line is applied to the switch elements in parallel or wherein a respective digital control line is applied to a first switch element, which regenerates the state of the digital control line for control of a second switch element, forming a series. Likewise, a respective digital control line may be applied to one or more first elements, and at least one of the first elements generates a signal which serves as an input to one or more second elements, the first and second elements controlling respective switches, providing a hybrid series/parallel configuration.

The analog representations may be communicated through a respective plurality of separate antennas. The plurality of analog representations may comprise radio frequency signals in respectively different radio frequency bands.

A respective digital radio frequency signal input may receive a signal from a digital channelizer adapted to define a digital representation of a radio frequency signal having a plurality of data transmission channels. A plurality of digital radio frequency signals within different radio frequency bands may be received through respective digital radio frequency signal inputs, and selectively concurrently routed through the non-blocking switch matrix to a plurality of digital to analog converters. At least one digital radio frequency signal processor may be provided, implementing a channelizing transmitter adapted to digitally up-convert digital representations from a plurality of data signals as channels within a radio frequency signal, to produce a respective digital radio frequency input. At least one digital radio frequency signal processor may be provided performing direct digital signal synthesis and digital up-conversion to generate a respective digital radio frequency signal input. A digital combiner may be provided for digitally combining at least two of digital radio frequency signal inputs and regenerated outputs, and providing an associated clock for the digitally combined signals.

A plurality of power amplifiers coupled to respective analog signal couplers may be provided, adapted to amplify the analog representations for transmission through a plurality of respective antennas.

The system may provide at least one power amplifier having a distortion characteristic, adapted to amplify an analog representations received from an analog signal coupler for transmission through an antenna, and a digital predistortion circuit for digitally precompensating for at least a portion of the distortion characteristic.

The system may further comprise a plurality of received analog signal couplers, for communicating a representation of a radio frequency signal; a respective analog to digital converter for each of the received analog signal couplers, each having an receiver output presenting a digital representation of the representation and an associated clock; a receive non-blocking switch matrix, receiving the plurality of receiver outputs and associated clocks, and producing a plurality of regenerated receiver outputs and associated regenerated clocks under selective control of a switch matrix signal; and a plurality of digital radio frequency signal processors, adapted to receive at least one regenerated receiver output from the receive non-blocking switch matrix and associated regenerated clock, thus implementing a transceiver. The control of the two switch matrices may be coordinated, for example to avoid transmitter interference with the receiver, or otherwise. Thus, the non-blocking switch matrix and the receive non-blocking switch matrix may be controlled by a common control system.

It is another object to provide a method for transmitting a radio frequency signal, comprising providing a plurality of digital radio frequency signal inputs, each having a respective associated clock, wherein a respective digital radio frequency signal input has a digital data rate sufficient to represent both the information and carrier, if any, in a corresponding analog representation of the digital radio frequency signal; selectively controlled a non-blocking switch matrix with a control signal, the non-blocking switch matrix receiving the plurality of inputs and associated clocks, and producing a plurality of regenerated outputs and associated regenerated clocks; producing an analog representation of the radio frequency signal input with a respective digital to analog converter for each of the regenerated outputs and associated regenerated clocks; and communicating the analog representations from the respective digital to analog converters to a location for transmission thereat.

The associated clock for at least two of the respective digital to analog converters may be independent, with the same or different frequencies, phases or other characteristics.

The associated clock for a respective digital to analog converter may operate above a Nyquist rate of the analog representation. A digital representation of an information signal modulated within a radio frequency signal may be generated.

A mapping of non-blocking switch matrix inputs to regenerated outputs under control of the control signal may be dynamically reconfigured substantially within a period of an associated clock. Analog representations having information signals modulated on different radio frequency bands may be communicated, with the non-blocking switch matrix routing the regenerated outputs and associated clocks to respective different digital to analog converters. The regenerated output may be an oversampled discrete representation of the analog representation. At least one of the digital to analog converters and the non-blocking switch matrix may comprise a plurality of superconducting elements operating at cryogenic temperatures.

The regenerated output and associated regenerated clock of a single output and associated clock may be simultaneously multicast from the non-blocking switch matrix for processing by a plurality of digital to analog converters.

At least one of the respective digital to analog converters may receive a parallel multiple binary bit digital representation of the representation of the radio frequency signal, with the parallel multiple binary bit digital representation and associated clock being routed from the non-blocking switch matrix.

The regenerated output and associated regenerated clock may be routed in a manner adapted to maintain proper synchronization therebetween.

A delay may be compensated with a delay compensation network adapted to maintain proper synchronization among a plurality of data paths, each data path communicating a regenerated output and a respective regenerated clock.

An input to output relationship between a respective digital radio frequency signal input and digital to analog converter of the non-blocking switch matrix may be dynamically reconfigured, under automated digital control.

The non-blocking switch matrix may comprise a plurality of switch elements each controlled by at least one digital control line, to provide a digitally controllable input to output relationship between a respective digital radio frequency signal input and digital to analog converter, wherein a respective digital control line is applied to the switch elements in parallel. The non-blocking switch matrix may also comprise a plurality of switch elements each controlled by at least one digital control line, to provide a digitally controllable input to output relationship between a respective digital radio frequency signal input and digital to analog converter, wherein a respective digital control line is applied to a first switch element, which regenerates the state of the digital control line for control of a second switch element.

The analog representations may be communicated through a respective plurality of separate antennas.

A respective digital radio frequency signal input may be generated with a digital channelizer adapted to define a digital representation of a radio frequency signal having a plurality of data transmission channels. Representations of a plurality of radio frequency signals within different radio frequency bands may be received through respective digital radio frequency signal inputs, and selectively concurrently routed through the non-blocking switch matrix to a plurality of digital to analog converters. Digital representations of a plurality of data signals, each representing a channel within a radio frequency signal, may be digitally up-converted. A digital radio frequency signal input may be generated by performing direct digital signal synthesis and digital up-conversion. At least two of digital radio frequency signal inputs and regenerated outputs may be digitally combined, with an associated clock provided for the digitally combined signals.

At least one digital radio frequency signal may be digitally precompensated for an analog distortion characteristic of an analog component, such as a power amplifier.

The method may further comprise converting a received analog signal to a digital signal, to produce a digital representation of the received analog signal and an associated clock; receiving the plurality of receiver outputs and associated clocks in a receive non-blocking switch matrix, and producing a plurality of regenerated receiver outputs and associated regenerated clocks under selective control of a switch matrix signal; and receiving at least one regenerated receiver output from the receive non-blocking switch matrix and associated regenerated clock. This therefore provides a transceiver method. Preferable, there is some coordination between the transmit and receive components, for example to avoid mutual interference. Thus, the non-blocking switch matrix and receive non-blocking switch matrix may be controlled by a common control system.

DETAILED DESCRIPTION OF THE INVENTION

I. Basic Switching Cells

RSFQ logic, first developed by Likharev, Semenov, and Mukhanov, is built around Josephson junctions (JJs), with lossless propagation of single-flux-quantum (SFQ) voltage pulses, each corresponding to an integrated pulse of 2 mV-ps. Two different types of RSFQ switch cells are described, both of which are well known in the literature: the DC switch and the NDRO switch. In either case, the general principle of operation is the same. A JJ is biased such that an SFQ pulse will cause it to temporarily exceed its critical current and then return to its previous state, thus emitting another SFQ pulse. The switching time, which depends on the critical current density (Jc) of the JJ, is about 2 ps for the Jc=4.5 kA/cm$^2$. This ultrafast switching allows a very high rate (40 Gbps and higher) of SFQ digital signals. Whether or not a switch responds to an input SFQ pulse depends on its designed control conditions (DC bias, control current, or other concurrent digital events). For example, the state of the switch—whether it will pass or block a digital input—may be controlled by the state of a coupled flip-flop, where control information could be stored.

Figure 1A:
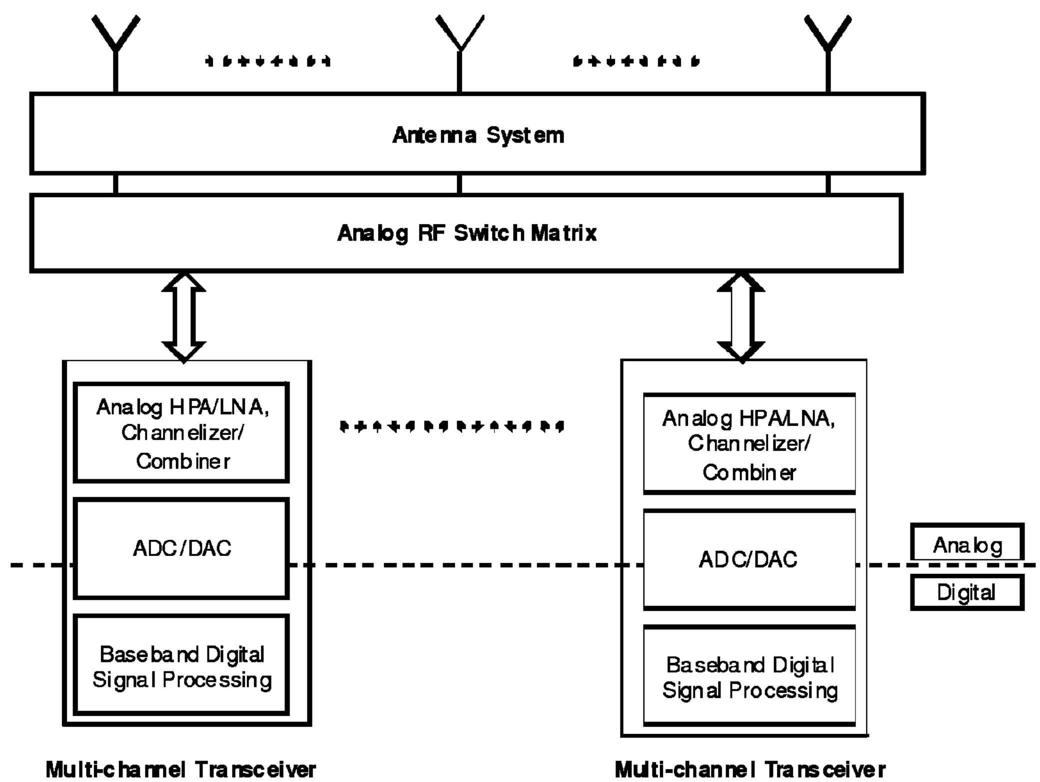
FIG. 1A is a block diagram of a multi-band, multi-channel RF transceiver system incorporating an analog switch matrix as known in the prior art.
Figure 1B:
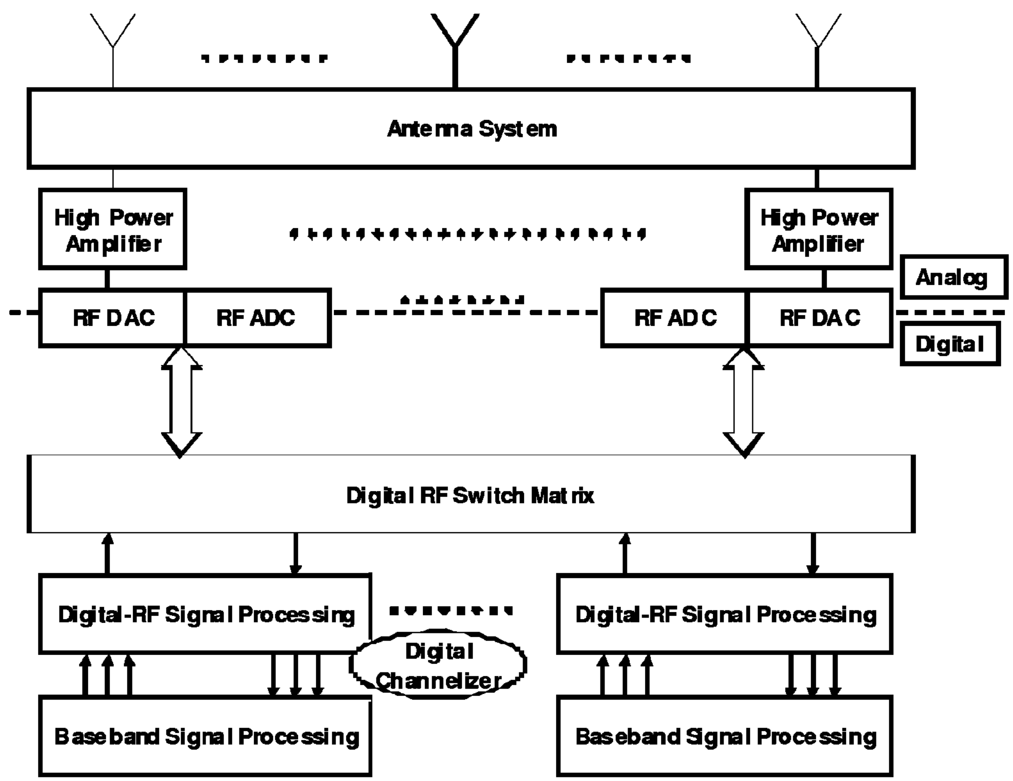
FIG. 1B is a block diagram of a multi-band, multi-channel RF transceiver system incorporating a new digital switch matrix for use with digital RF architectures in accordance with one aspect of the invention.
Figure 2:
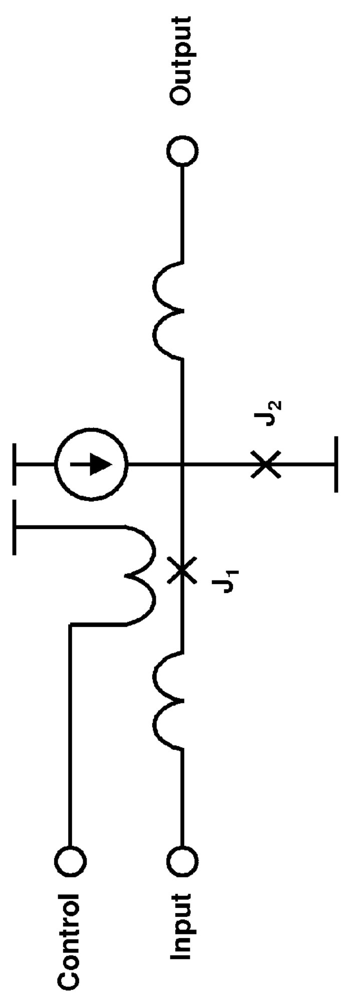
FIG. 2 shows a basic digital switch using Josephson junctions.

FIG. 2 shows a schematic diagram of a simple DC-switch with only 2 JJs, which is controlled by applying DC current to the control line.

Figure 3B:
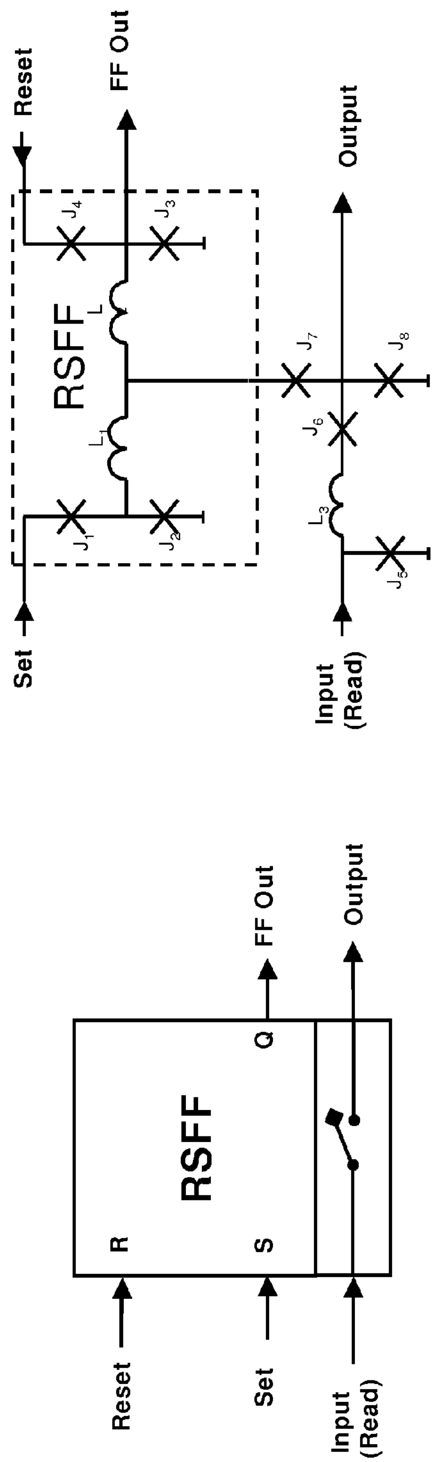
FIG. 3B is a schematic diagram of the digital switch based on a non-destructive readout (NDRO) cell.
Figure 3A:
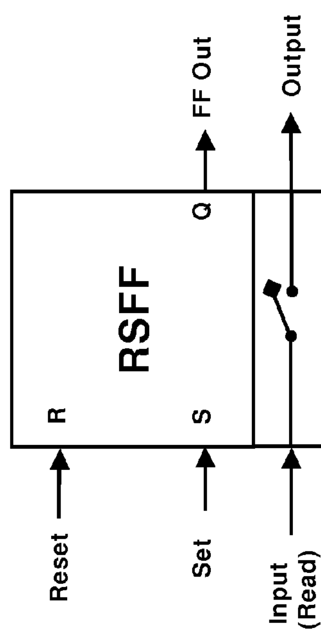
FIG. 3A is a block diagram of a digital switch based on a non-destructive readout (NDRO) cell.

FIGS. 3A and 3B show another digital switch element, called a non-destructive readout (NDRO) switch, where the control information is stored in a reset-set flip-flop (RSFF). (The NDRO switch with 8 JJs is more complex for a single switch, but is more easily scalable to large switch matrices.) An SFQ pulse applied to the Set input sets the RSFF to the ‘1’ state. While it is in the ‘1’ state, any pulse applied to the input will be read out as an SFQ pulse at the output synchronized to the clock input. This corresponds to the ‘ON’ (closed) state of the switch.

If a pulse is applied to the Reset input, the RSFF is reset to the ‘0’ state. While it is in the ‘0’ state, any pulse applied to the input will escape through J6 and no SFQ pulse will be produced at the output. This corresponds to the ‘OFF’ (open) state of the switch. One advantage of this type of switch is that only one external control line is required for each cell to write the desired switch states for the entire matrix. Thus the control for the entire matrix can be stored as a serial digital word. This is achieved by simply connecting the RSFFs of different switch cells as a shift register by applying the FF Out to the Set input of the next RSFF.

One needs to route both data and clock from each input source through the switch to desired output ports, for fully asynchronous operation. Of course, this can be accomplished by two switch cells which are manually set (reset) together. However a more elegant solution is part of one aspect of the invention by routing the clock signal through an NDRO switch and controlling propagation of the data stream through an RSFF (see FIG. 4 where the clock line is shown as a dashed line), thus reducing the JJ count necessary.

Figure 4:
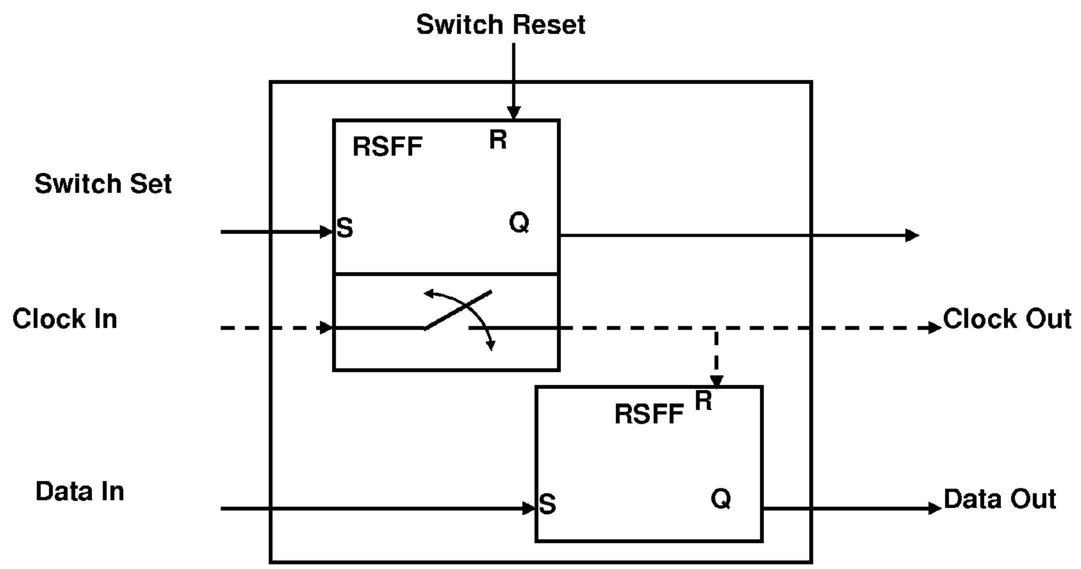
FIG. 4 is a novel switch cell for routing clock and data together.

FIG. 4 can be extended to accommodate a n-bit parallel data stream by replicating instance of the Data RSFF for each bit stream of the n-bit parallel data stream, with each RSFF being reset by the clock output signal.

II. Routing Switch Architecture

Figure 5:
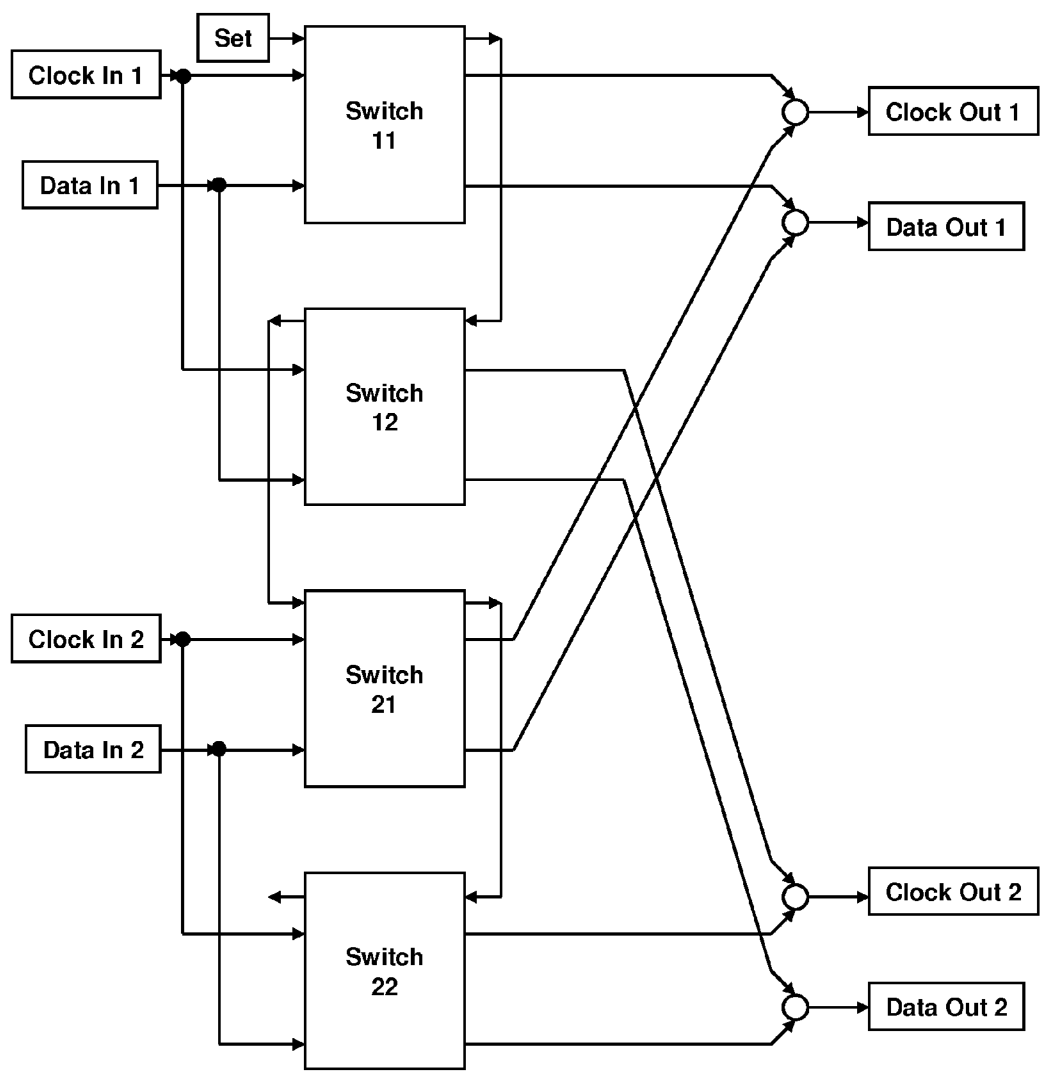
FIG. 5 is a block diagram of a 2×2 building-block for a 1:1 router matrix.

Consider a switch architecture where each input is routed only to a single output. (This constraint will be relaxed later.) To see how to scale up from a single switch, consider first a 2×2 building block (see FIG. 5). This is done with 4 switch cells. The data and clock signals from the first input are applied to Switch 11 and Switch 12 respectively, and the data and clock signals from the second input are applied to Switch 21 and Switch 22 respectively. The data and clock outputs from Switch 11 and Switch 21 are merged (combined) at the first output port, and the data and clock outputs from Switch 12 and Switch 22 are merged (combined) at the second output port. We have shown both clock and data paths, as well as the control (set) line, explicitly to illustrate the complexity of the design. We did not show the reset line, which will add to the routing complexity, but could be laid out similarly to the set lines in a way that should be obvious to one skilled in the art. Throughout the layout, maintaining accurate relative timing between paired clock and data signals is essential for correct operation.

Figure 6:
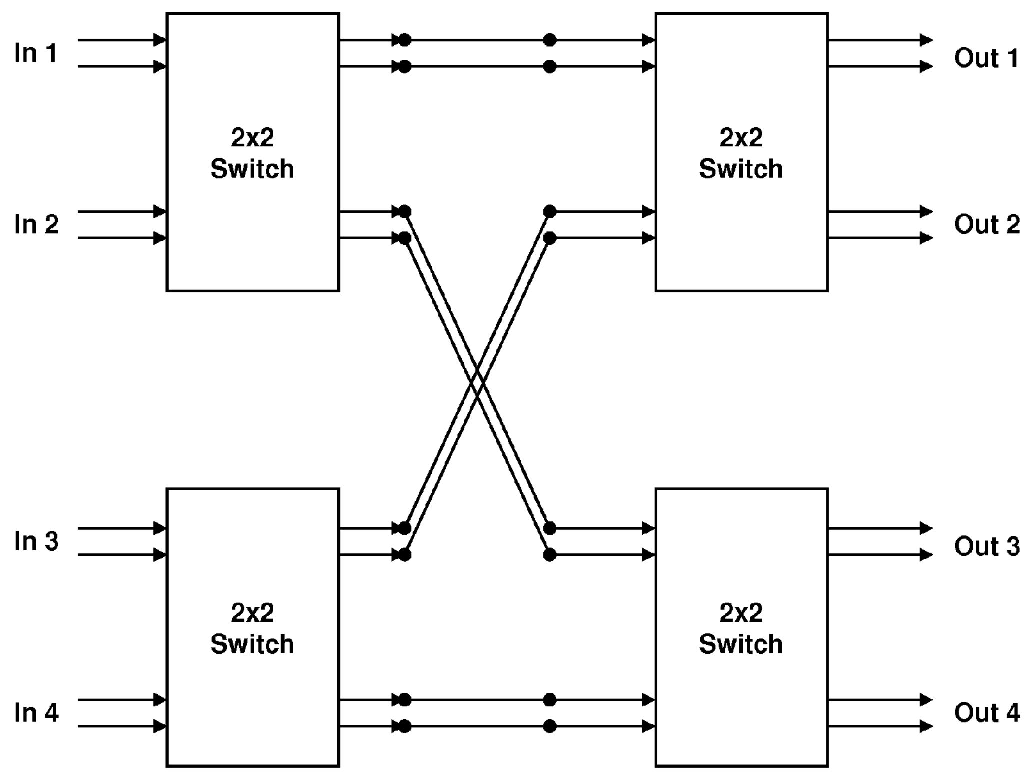
FIG. 6 is a block diagram of a 4×4 switch matrix consisting of four 2×2 building-blocks in a Banyan network.

Once a 2×2 switching network is complete, standard network approaches can be used to generate larger networks. For example, FIG. 6 shows the design of a 4×4 switch using the well-known, scalable Banyan network, with the double lines indicating routing of both data and clock signals together.

III. Architecture of Multicasting, Cross-Point Switch Matrix

Figure 8:
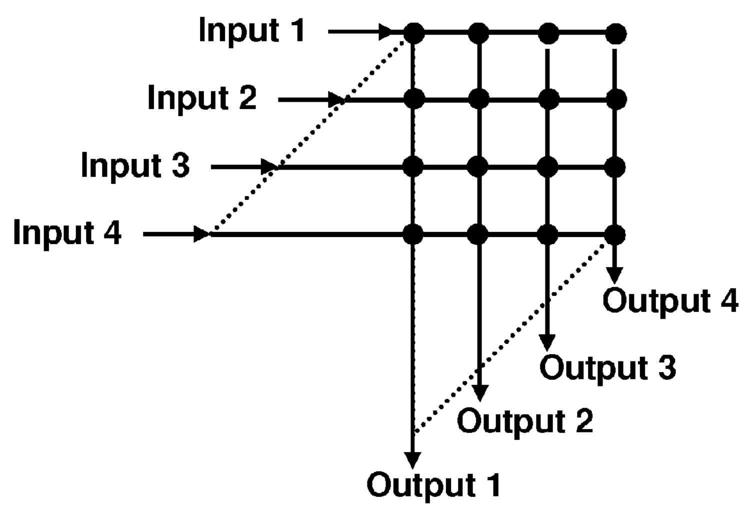
FIG. 8 shows an optional delay compensation network for a multicasting switch matrix of the type shown in FIG. 7.
Figure 7:
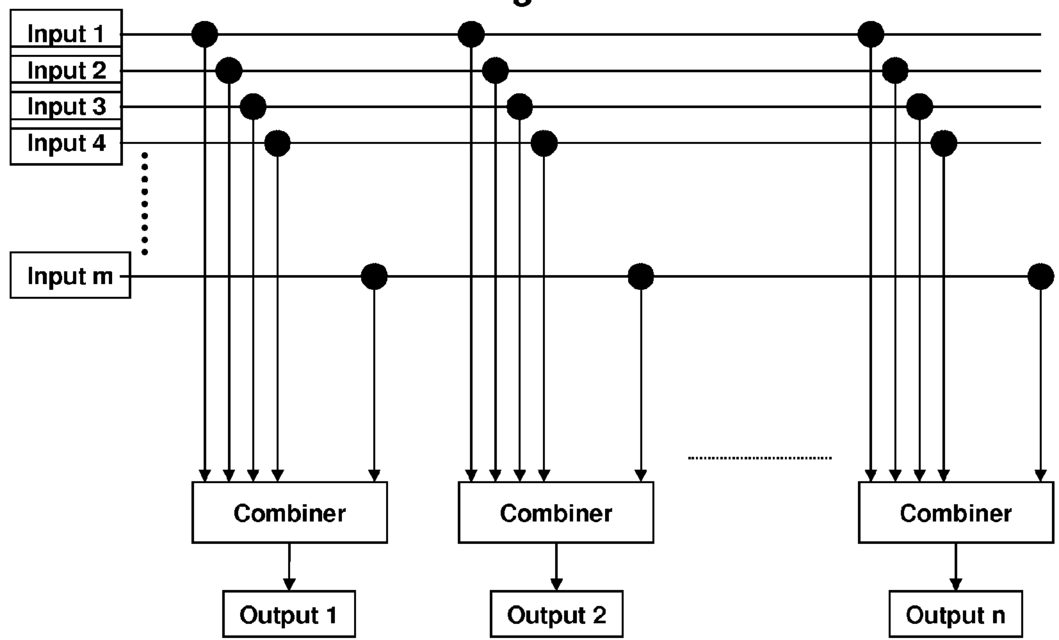
FIG. 7 shows a block diagram of a multicasting switch matrix in accordance with one aspect of the invention.

For some applications, it is necessary to copy one input to multiple outputs, or vice versa. The relevant switch architecture here is an M×N cross-point switch matrix that connects M inputs to N outputs (FIG. 7). Here each input propagates horizontally through a set of switch cells. If a switch is turned on, a copy of the input data stream is routed down the corresponding column towards an output port; there is no degradation of signal quality since digital copying is lossless. Any number of switches may be turned on in each row to produce copies of the input at multiple output ports. There is a potential problem of latency in this structure, since the signal propagation paths from an input port to different output ports is different. For most communications applications, such small differences in propagation delays (a nanosecond or less) do not matter. Delay compensation networks (shown as triangles in FIG. 8) can be added for applications, such as a network switch for multiprocessor supercomputers, that are sensitive to delay mismatches. Delay compensation can be achieved using passive lines of matched physical lengths or active transmission structures with matching delay times (such as tunable Josephson transmission lines).

Figure 9A:
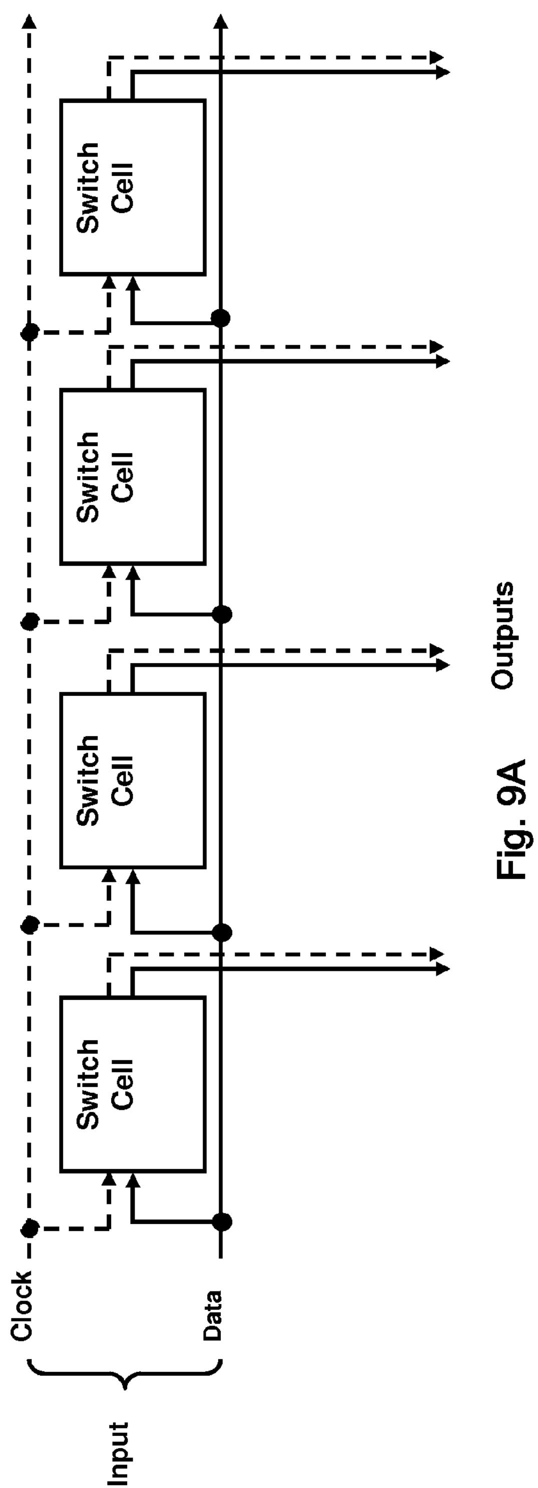
FIGS. 9A and 9B show implementations of a multicasting switch using RSFQ cells, respectively with and without clock accompanying a data line.
Figure 9B:
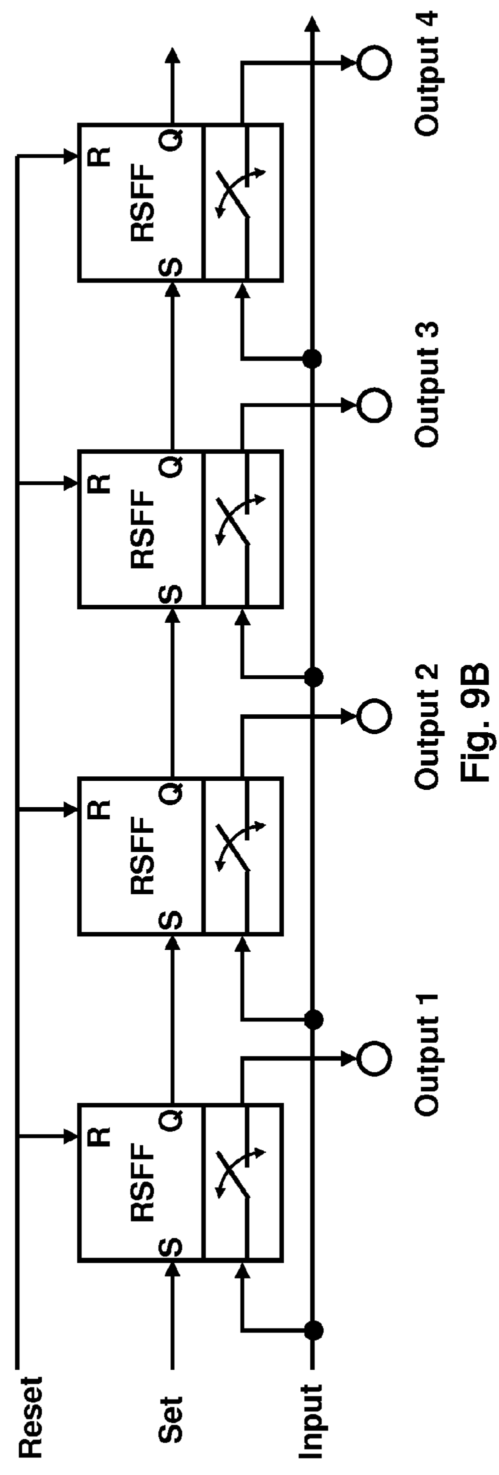

We can use the same DC and NDRO switches (FIGS. 2 and 3 or the switch cell of FIG. 4) to build this multicasting switch matrix depending on weather the clock line accompanies the data line. The building block of this matrix is a row (FIGS. 9A and 9B).

The multicasting switch matrix architecture in FIG. 7 is composed of M×N switches as in FIG. 3. Each switch has a set and reset line that permits the routing to be dynamically modified. For many implementations, as suggested in FIG. 9B, the "set" lines may be connected in series, and the entire M×N array addressed by a single digital word. Given the very fast clock speed, the entire array can be reconfigured in a short time. For very large arrays, partial parallel addressing (of separate rows, for example) may be used to speed up the reprogramming rate. In this way, one may direct any input to any and all of the outputs, in a way that is rapidly reconfigurable.

IV. Integration of Switch Matrix into Transceiver System

Figure 10:
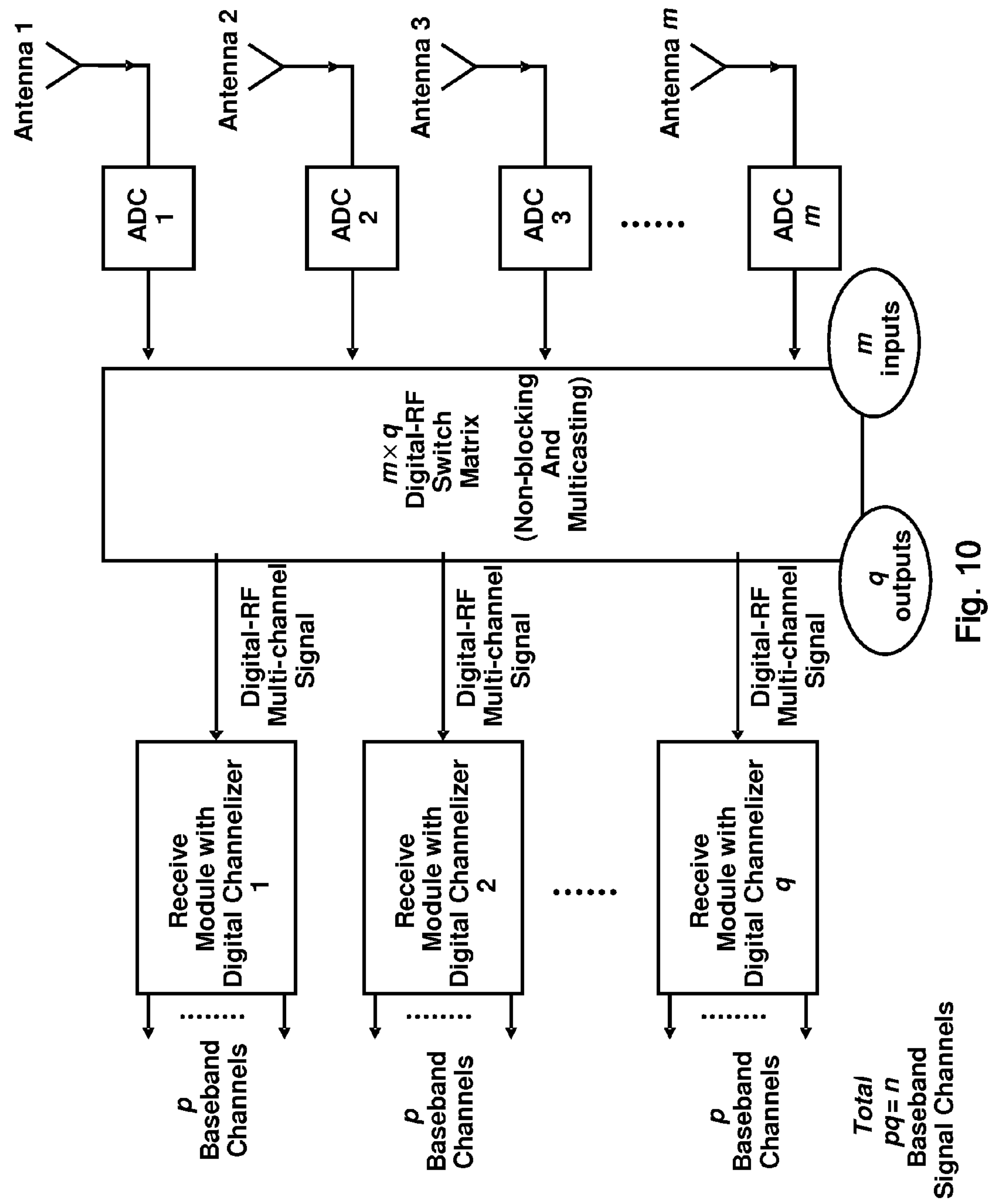
FIG. 10 is a block diagram of a digital-RF switch matrix for receiver systems showing size of the switching array.

To exemplify the advantages of digital routing of RF signals, let us examine the receive side in greater detail (FIG. 10). The analog RF input signals are digitized directly at RF using an ADC behind each antenna. Once the RF signals are in the digital domain, multiple copies can be generated without compromising signal power and quality. Therefore, the digital-RF signal can be simultaneously applied to a bank of digital channelizing units, each operating independently to extract a subband from a wide input band. For a multi-band system, digitized data streams from multiple ADC front-ends can be distributed to a bank of channelizers through a digital non-blocking, multicasting switch matrix. This architecture is scalable to an arbitrary number of channelizers (or more general digital processors) and banded antenna-ADC pairs. Furthermore, the digital switch matrix can be programmed in real time to dynamically reconfigure the communication system: changing band-to-channel allocation, cross-banding, etc.

In general, signal processing involves multiple steps, including multiple levels of channelization. For simplicity, here we have considered only the first level channelization function: extraction of a sub-band through mixing and filtering. This step requires digital-RF processing at clock speeds of 40 Gbps and beyond, and therefore, may be accomplished using superconductor electronics.

One special requirement for the switch matrix is its ability to support multiple input data rates. The ADCs may not share the same clock frequency. For example, the choice of clock frequency may depend on the center frequency of the band for convenient digital in-phase and quadrature (I & Q) mixing, which requires the clock to be 4 times higher or multiples thereof. An asynchronous or better-said multi-synchronous switch, routing both the clock and digitized data together, is essential to address this requirement. This ability to distribute digital signals with several different clock frequencies simultaneously within the same general-purpose switch matrix is a unique feature of one aspect of the invention.

Figure 11:
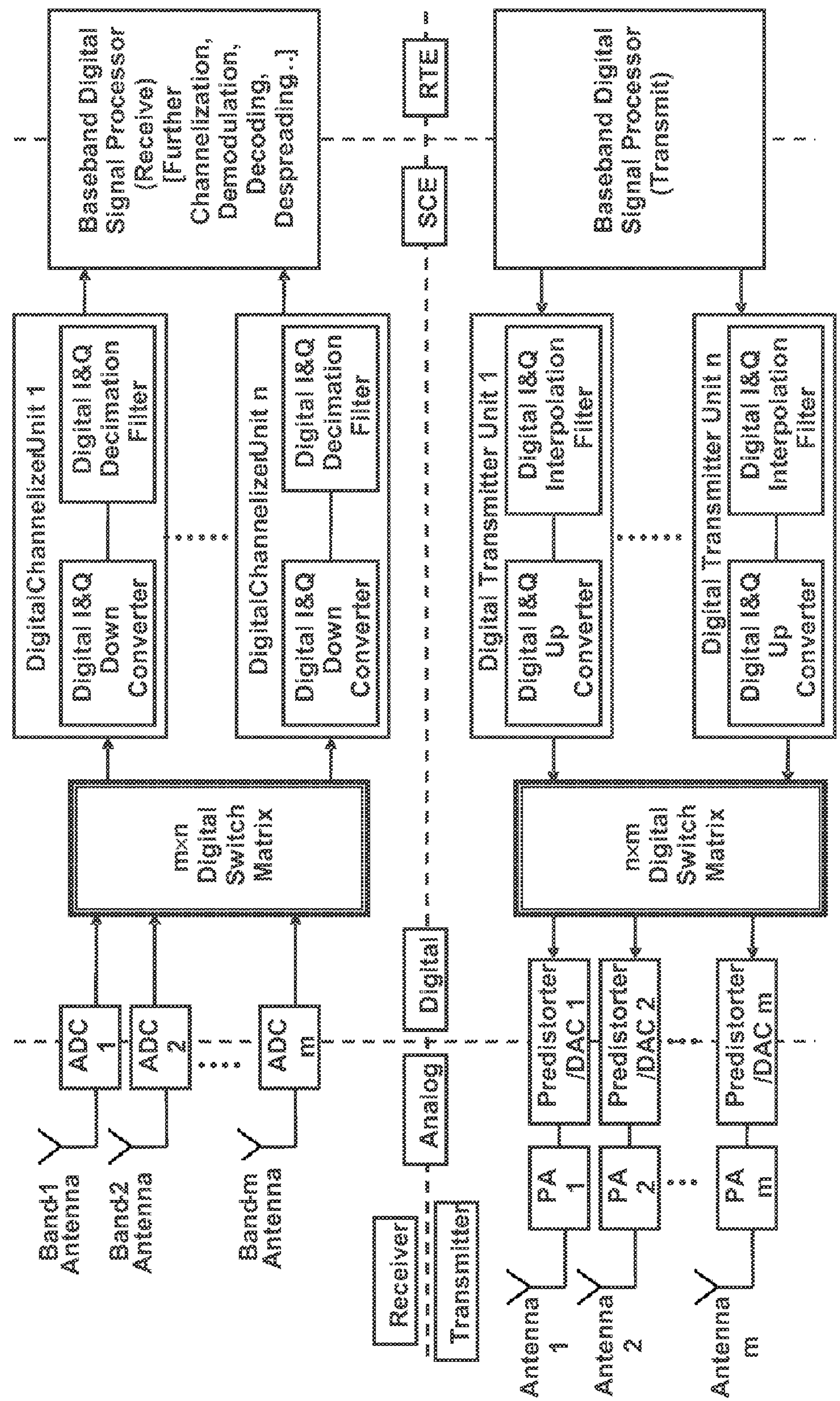
FIG. 11 shows a block diagram of a digital switch matrix included in both a receiver and transmitter of a complete digital-RF transceiver system.

A general block diagram of a complete direct digital-RF communication system is shown in FIG. 11. A multi-band RF communication system consists of an antenna subsystem to capture electromagnetic energy in different RF bands and a transceiver subsystem to transmit and receive information from each RF band through a variety of signal processing steps (e.g., up/down-conversion, filtering, modulation/demodulation, coding/decoding, etc.). The goal is to dynamically assign the available signal processing resources to the input bands to meet the communication needs. This requires dynamic RF distribution and routing. The top half of FIG. 11 shows the receive side, where direct digitization of RF signals by analog-to-digital converters (ADCs) is followed by programmable digital routing to a bank of digital processing units. The bottom half shows the reciprocal transmit side. Here, multiple transmit signals are digitally synthesized and connected to digital-to-analog converters (DACs), coupled to digital-RF predistorters that linearize the RF transfer function of high power amplifiers (HPAs) directly.

A similar switch matrix may also be incorporated within a digital-RF transmitter system. In one embodiment of the invention, as indicated in the Multicasting Switch Matrix in FIG. 7, it may be desirable to direct more than one digital-RF input to be combined in the same output. Functionally, the multiple inputs may be added in a Combiner circuit, where this must be carried out in the Digital Domain in the digital-RF signals. Let us assume here that the clock frequencies of these signals to be added are the same. That is generally the case for signals designed for transmission using the same output antenna, which are within the same output band. Then the Combiner circuit can be implemented as simply a fast clocked Binary Adder, as has already been demonstrated in RSFQ technology. The outputs of the Binary Adder circuit may be passed along to a multi-bit Digital-to-Analog converter (DAC), the output of which can then be passed to an RF Power Amplifier, and then to a Transmission Antenna.

Figure 12:
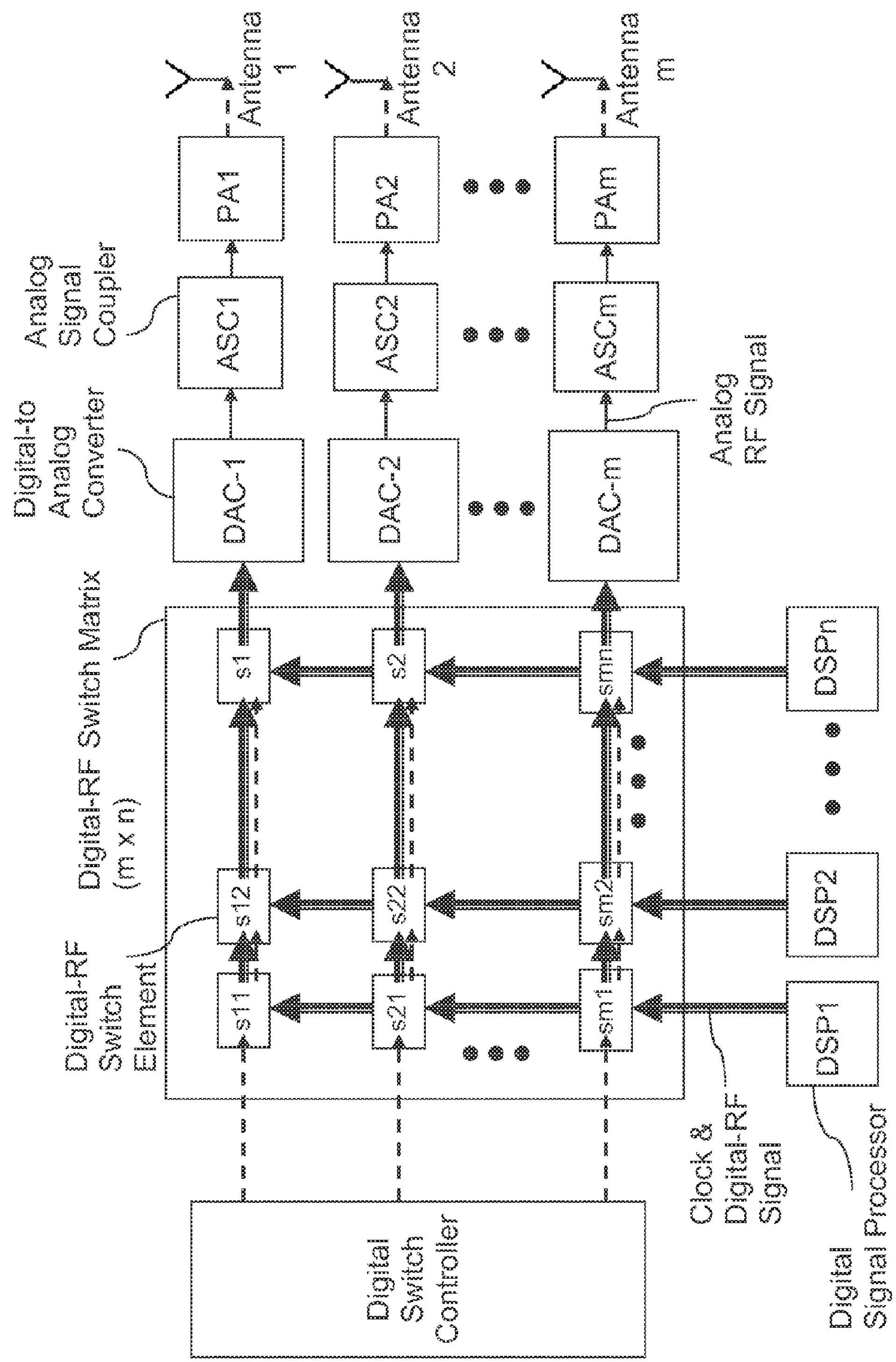
FIG. 12 shows a schematic drawing of a transmitter.

FIG. 12 shows a schematic diagram of a transmitter system. A set of digital signal processors $DSP_1 \ldots DSP_n$ produces a set of signals, corresponding to analog radio frequency signals. Each DSP has an associated clock, which may be the same or different in phase, frequency, or the like. The DSP signals enter a switch matrix having switch elements $s_{11} \ldots s_{mn}$, under control of a Digital Switch Controller, which routes the signal from each DSP to one or more Digital-to-Analog Converters DAC-1 . . . DAC-m. In some cases, a DSP may be idle, and not connected to any endpoint. Likewise, a particular DAC may also be idle. Each DAC-1 . . . DAC-m has a respective analog signal coupler, which, for example, may lead to an antenna or analog signal processing environment, such as a combiner. A DSP and/or DAC may have an associated pre-distortion circuit (not shown) which corrects the switched digital signal for distortion that it will encounter, for example, as a result of an analog power amplification process.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A radio frequency transmitter for transmitting a radio frequency transmission signal, comprising:

a plurality of inputs, each of the inputs receiving a respective associated clock of a plurality of associated clocks and a respective digital radio frequency signal of a plurality of digital radio frequency signals, wherein the respective digital radio frequency signal has a digital data rate sufficient to represent both an information content and a carrier, if any, in a corresponding analog representation of a radio frequency signal received through a respective one of the plurality of inputs;

a non-blocking switch matrix, selectively controlled by a control signal from a controller, configured to receive the plurality of associated clocks and the plurality of digital radio frequency signals, and configured to produce a plurality of regenerated associated clocks and a plurality of regenerated digital radio frequency signals;

the controller is configured to rout the plurality of regenerated associated clocks and the plurality of regenerated digital radio frequency signals from each of the plurality of inputs to a plurality of digital to analog converters, the digital to analog converters are configured to convert the plurality of regenerated digital radio frequency signals into a plurality of analog radio frequency signals; and a plurality of analog signal couplers configured to communicate the plurality of analog radio frequency signals to a location for transmission of the radio frequency transmission signal thereat.

2. The transmitter according to claim 1, wherein at least two of the plurality of regenerated associated clocks are independent.

3. The transmitter according to claim 1, wherein the plurality of regenerated associated clocks operate above a Nyquist rate of the corresponding analog representation of the plurality of digital radio frequency signals.

4. The transmitter according to claim 1, further comprising a digital signal processor configured to generate the plurality of digital radio frequency signals.

5. The transmitter according to claim 1, wherein the non-blocking switch matrix is configured to dynamically reconfigure a mapping of the plurality of digital radio frequency signals to the plurality of regenerated digital radio frequency signals under the control of the control signal substantially within a period of an associated clock.

6. The transmitter according to claim 1, wherein at least two of the plurality of analog signal couplers are configured to receive the plurality of analog radio frequency signals having information content modulated on different radio frequency bands, the non-blocking switch matrix routing the plurality of regenerated associated clocks and the plurality of regenerated digital radio frequency signals to different respective ones of the plurality of digital to analog converters.

7. The transmitter according to claim 1, wherein the plurality of regenerated digital radio frequency signals each represent an oversampled discrete representation of the analog representation of the plurality of analog radio frequency signals produced by the plurality of digital to analog converters.

8. The transmitter according to claim 1, wherein at least one of:

the plurality of digital to analog converters, and the non-blocking switch matrix, comprises a plurality of superconducting elements operating at cryogenic temperatures.

9. The transmitter according to claim 1, wherein the non-blocking switch matrix is further configured to simultaneously multicast a respective one of the plurality of regenerated associated clocks and the plurality of regenerated digital radio frequency signals for processing by a respective one of the plurality of digital to analog converters.

10. The transmitter according to claim 1, wherein at least one of the plurality of digital to analog converters receives a parallel multiple binary bit digital representation of a respective one of the plurality of digital radio frequency signals and an associated clock routed through the non-blocking switch matrix.

11. The transmitter according to claim 1, wherein the non-blocking switch matrix is further configured to rout the plurality of regenerated associated clocks and the plurality of regenerated digital radio frequency signals while maintaining proper synchronization.

12. The transmitter according to claim 1, wherein the non-blocking switch matrix is further configured to rout the plurality of regenerated associated clocks and the plurality of regenerated clocks digital radio frequency signals to maintain proper synchronization at a respective one of the plurality of digital to analog converters for each of the plurality of regenerated associated clocks and the plurality of regenerated digital radio frequency signals.

13. The transmitter according to claim 1, wherein the non-blocking switch matrix comprises a delay compensation network configured to maintain proper synchronization among a plurality of data paths within the non-blocking switch matrix, each of the plurality of data paths generating a respective associated clock and a respective regenerated digital radio frequency signal.

14. The transmitter according to claim 1, wherein the non-blocking switch matrix is further configured to simultaneously distribute the plurality of regenerated associated clocks and the plurality of regenerated digital radio frequency signals, the plurality of regenerated associated clocks having respectively different clock frequencies.

15. The transmitter according to claim 1, wherein the non-blocking switch matrix comprises a Banyan network.

16. The transmitter according to claim 1, wherein the non-blocking switch matrix has an input-to-output relationship between a respective one of the plurality of digital radio frequency signals and a respective one of the plurality of digital to analog converters which is dynamically reconfigurable under automated digital control.

17. The transmitter according to claim 1, wherein the non-blocking switch matrix comprises a plurality of switch elements, each controlled by at least one digital control line, to provide a digitally controllable input-to-output relationship between a respective one of the plurality of digital radio frequency signals and a respective one of the plurality of digital to analog converters, wherein a respective digital control line is applied to the plurality of switch elements in parallel.

18. The transmitter according to claim 1, wherein the non-blocking switch matrix comprises a plurality of switch elements, each controlled by a state of at least one digital control line, to provide a digitally controllable input-to-output relationship between a respective one of the plurality of digital radio frequency signals and a respective one of the plurality of digital to analog converters, wherein a respective digital control line is applied to a first switch element, which regenerates the state of the respective digital control line for control of a second switch element.

19. The transmitter according to claim 1, wherein the non-blocking switch matrix comprises a plurality of switch elements each controlled by a state of at least one digital control line, to provide a digitally controllable input-to-output relationship between a respective one of the plurality of digital radio frequency signals and a respective one of the plurality of digital to analog converters, wherein a respective digital control line is applied to a plurality of first switch elements, which regenerate the respective state of the respective digital control line for control of at least one second switch element.

20. The transmitter according to claim 1, wherein the analog radio frequency signal from each of the plurality of digital to analog converters is communicated through a respective one of a plurality of separate antennas for transmission of the radio frequency transmission signal.

21. The transmitter according to claim 1, wherein each analog representation of the respective one of the plurality of digital radio frequency signals comprises a radio frequency signal in a respectively different radio frequency band.

22. The transmitter according to claim 1, wherein a respective one of the plurality of digital radio frequency signals receives a signal from a digital channelizer configured to define a digital representation of the radio frequency signal having a plurality of data transmission channels.

23. The transmitter according to claim 1, wherein the plurality of digital radio frequency signals within different radio frequency bands are received through the plurality of inputs, and selectively concurrently routed through the non-blocking switch matrix to the plurality of the digital to analog converters.

24. The transmitter according to claim 1, further comprising at least one digital signal processor configured to digitally up-convert digital representations from a plurality of data signals as the plurality of digital radio frequency signals, each representing respective channels within the radio frequency transmission signal.

25. The transmitter according to claim 1, further comprising at least one digital signal processor configured to perform direct digital signal synthesis and digital up-conversion to generate a respective one of the plurality of digital radio frequency signals.

26. A method for transmitting a radio frequency transmission signal, comprising:

providing a plurality of associated clocks and a plurality of digital radio frequency signals to a plurality of inputs, each of the inputs receiving a respective associated clock and a respective digital radio frequency signal, wherein the respective digital radio frequency signal has a digital data rate sufficient to represent both an information content and a carrier, if any, in a corresponding analog representation of a radio frequency signal received through a respective one of the plurality of inputs;

selectively controlling a non-blocking switch matrix with a control signal from a controller, the non-blocking switch matrix receiving the plurality of associated clocks and the plurality of digital radio frequency signals, and producing a plurality of regenerated associated clocks and a plurality of regenerated digital radio frequency signals;

routing the plurality of regenerated associated clocks and the plurality of regenerated digital radio frequency signals by the controller from each of the plurality of inputs to a plurality of digital to analog converters and converting the plurality of regenerated associated clocks and the plurality of regenerated digital radio frequency signals into a plurality of analog radio frequency signals; and communicating the plurality of analog radio frequency signals to a location for transmission of the radio frequency transmission signal thereat.

27. The method according to claim 26, wherein at least two of the plurality of regenerated associated clocks are independent.

28. The method according to claim 26, wherein the plurality of regenerated associated clocks operate above a Nyquist rate of the corresponding analog representation of the plurality of digital radio frequency signals.

29. The method according to claim 26, further comprising generating a digital representation of an information signal modulated within at least one of the plurality of digital radio frequency signals.

30. The method according to claim 26, further comprising dynamically reconfiguring a mapping of the plurality of digital radio frequency signals to the plurality of regenerated digital radio frequency signals under the control of the control signal substantially within a period of an associated clock.

31. The method according to claim 26, further comprising converting the plurality of digital radio frequency signals having information content modulated on different radio frequency bands, the non-blocking switch matrix routing the plurality of regenerated associated clocks and the plurality of regenerated digital radio frequency signals to a different respective digital to analog converter.

32. The method according to claim 26, wherein each of the plurality of regenerated digital radio frequency signals is an oversampled discrete representation of the analog representation of the plurality of analog radio frequency signals.

33. The method according to claim 26, wherein at least one of:

the plurality of digital to analog converters, and the non-blocking switch matrix, comprises a plurality of superconducting elements operating at cryogenic temperatures.

34. The method according to claim 26, further comprising simultaneously multicasting one of the plurality of regenerated associated clocks and the plurality of regenerated digital radio frequency signals for processing by a respective one of the plurality of the digital to analog converters.

35. The method according to claim 26, wherein the plurality of digital to analog converters receives a parallel multiple binary bit digital representation a respective one of the plurality of digital radio frequency signals and an associated clock routed through the non-blocking switch matrix.

36. The method according to claim 26, wherein the plurality of regenerated associated clocks and the plurality of regenerated digital radio frequency signals are routed while maintaining a proper synchronization therebetween.

37. The method according to claim 26, further comprising dynamically reconfiguring, under automated digital control, an input-to-output relationship of the non-blocking switch matrix between a respective one of the plurality of digital radio frequency signals and a respective one of the plurality of digital to analog converters.

38. The method according to claim 26, wherein the non-blocking switch matrix comprises a plurality of switch elements each controlled by at least one digital control line, to provide a digitally controllable input-to-output relationship between a respective one of the plurality of digital radio frequency signals and a respective one of the plurality of digital to analog converters, wherein a respective digital control line is applied to the plurality of switch elements in parallel.

39. The method according to claim 26, wherein the non-blocking switch matrix comprises a plurality of switch elements, each controlled by at least one digital control line, to provide a digitally controllable input-to-output relationship between a respective one of the plurality of digital radio frequency signals and a respective one of the plurality of digital to analog converters, wherein a respective digital control line is applied to a first switch element, which regenerates the state of the respective digital control line for control of a second switch element.

40. The method according to claim 26, wherein a respective one of the plurality of digital radio frequency signals is generated with a digital channelizer to define a digital representation of the radio frequency signal having a plurality of data transmission channels.

41. The method according to claim 26, wherein the plurality of digital radio frequency signals within different radio frequency bands are received through the plurality of inputs, and selectively concurrently routed through the non-blocking switch matrix to the plurality of digital to analog converters.

42. The method according to claim 26, further comprising digitally up-converting digital representations from a plurality of data signals as the plurality of digital radio frequency signals, each representing respective channels within the radio frequency transmission signal.

43. The method according to claim 26, further comprising performing direct digital signal synthesis and digital up-conversion to generate a respective one of the plurality of digital radio frequency signals.

44. The method according to claim 26, further comprising digitally combining at least two signals selected from the group consisting of the plurality of digital radio frequency signals to produce digitally combined signals.

45. The method according to claim 26, further comprising digitally precompensating at least one of the plurality of digital radio frequency signals for an analog distortion characteristic of an analog system component.

* * * * *